(12) United States Patent
Yehezkely (10) Patent No.: US 8,504,952 B2
(45) Date of Patent: Aug. 6, 2013

(54) ELECTROSTATIC DISCHARGE (ESD) PROTECTION CIRCUIT AND METHOD FOR DESIGNING THEREOF FOR PROTECTION OF MILLIMETER WAVE ELECTRICAL ELEMENTS

(75) Inventor: Alon Yehezkely, Tel-Aviv (IL)

(73) Assignee: Wilocity, Ltd., Caesarea (IL)

( * ) Notice: Subject to any disclaimer, the term of this patent is extended or adjusted under 35 U.S.C. 154(b) by 111 days.

(21) Appl. No.: 12/980,085

(22) Filed: Dec. 28, 2010

(65) Prior Publication Data
US 2012/0162834 A1    Jun. 28, 2012

(51) Int. Cl.
*G06F 17/50* (2006.01)
*H02H 9/00* (2006.01)

(52) U.S. Cl.
USPC ........... 716/100; 716/101; 716/106; 716/132; 716/135; 716/136; 361/56

(58) Field of Classification Search
USPC ..... 716/100, 101, 106, 132, 135, 136; 361/56
See application file for complete search history.

(56) References Cited

U.S. PATENT DOCUMENTS

| | | | | |
|---|---|---|---|---|
| 7,750,408 B2 * | 7/2010 | He et al. | | 257/355 |
| 7,852,281 B2 * | 12/2010 | Choudhury | | 343/851 |
| 8,015,538 B2 * | 9/2011 | Coolbaugh et al. | | 716/136 |
| 8,024,679 B2 * | 9/2011 | Hsu et al. | | 716/101 |
| 8,035,190 B2 * | 10/2011 | Liu et al. | | 257/510 |
| 8,079,002 B1 * | 12/2011 | Lo et al. | | 716/106 |
| 8,171,435 B2 * | 5/2012 | He et al. | | 716/100 |
| 2006/0250731 A1 | 11/2006 | Parkhurst et al. | | |
| 2008/0112101 A1 | 5/2008 | McElwee et al. | | |
| 2010/0128402 A1 * | 5/2010 | Besse et al. | | 361/56 |
| 2010/0277840 A1 | 11/2010 | Huang et al. | | |
| 2012/0062334 A1 * | 3/2012 | Yehezkely | | 333/119 |
| 2012/0099228 A1 * | 4/2012 | Lin et al. | | 361/56 |

OTHER PUBLICATIONS

Wallash et al.; "A new electrical overstress (EOS) test for magnetic recording heads"; Publication Year: 2006; Electrical Overstress/Electrostatic Discharge Symposium, 2006. EOS/ESD '06; pp. 131-135.*

(Continued)

*Primary Examiner* — Helen Rossoshek
(74) *Attorney, Agent, or Firm* — Myers Wolin, LLC (57) ABSTRACT

A miniaturized electrostatic discharge (ESD) protection circuit designed for millimeter wave electrical elements, wherein the ESD protection circuit is fabricated on a multilayer substrate. The ESD protection circuit comprises a metal line being connected at one end to a ground and at other end to a connective strip, wherein a length of the metal line is a maximum length that achieves a resistance value defined for the ESD protection circuit and a width of the metal line is set to a maximum width allowed for the multilayer substrate, wherein the metal line introduces a inductance value into the ESD protection circuit; and a capacitor being connected in parallel to the metal line and having a capacitance value resonating the metal line at an operating frequency band, thereby the ESD protection circuit shunts ESD pulses to the ground and passes signals at the operating frequency band.

23 Claims, 6 Drawing Sheets

OTHER PUBLICATIONS

Smedes et al.; "Selecting an appropriate esd protection for discrete RF power LDMOSTs"; Publication Year: 2005; Electrical Overstress/Electrostatic Discharge Symposium, 2005. EOS/ESD '05; pp. 1- 8.*

Ding et al.; "An ESD-protection-free monolithic harmonic filter for WLAN applications"; Publication Year: 2010; Silicon Monolithic Integrated Circuits in RF Systems (SiRF), 2010 Topical Meeting on; pp. 228-231.*

J.-D. Park and A.M. Niknejad, "Ladder-shaped network for ESC protection of millimetre-wave CMOS ICs", Electronics LEtters, Jul. 16, 2009, vol. 45, No. 15.

Natarajan, et al., "ESD Protection for a 5.5 GHz LNA in 90 nm RF CMOS—Implementation Concepts, Constraints and Solutions", IMEC, Kapeldreef 75, 3001 Leuven, Belgium.; 2010.

* cited by examiner

ELECTROSTATIC DISCHARGE (ESD) PROTECTION CIRCUIT AND METHOD FOR DESIGNING THEREOF FOR PROTECTION OF MILLIMETER WAVE ELECTRICAL ELEMENTS

FIELD OF THE INVENTION

The present invention generally relates to radio frequency (RF) electrostatic discharge (ESD) protection circuits, and more particularly to ESD protection of millimeter wave (mm-wave) circuits.

BACKGROUND OF THE INVENTION

Electrostatic discharge (ESD) is the sudden and momentary electric current that flows between two electric elements at different electrical potentials. ESD events may cause damage to electronic equipment, especially in solid-state electronics, such as integrated circuits. As fabrication of integrated circuits is moving into sub-micron processes, the circuits are more vulnerable to stress due to ESD. That is, as fabrication, e.g., CMOS, processes downscale, ESD robustness degrades due to the metallization layers being thinner, hence having higher sheet resistance.

Recently developed techniques allow fabricating radio frequency integrated circuits (RFICs) that operate in millimeter wave frequencies, typically using deep sub-micron CMOS technology. In order to enable proper and safe operation of ICs, on-chip ESD protection should be included. In a design of an RFIC, a critical point that requires ESD protection is at the RF front-end between the low noise amplifier (LNA) and antenna(s). The LNA, which is commonly the most sensitive element in the RF front end, is typically exposed to ESD sparks (pulses) induced through the antenna pins.

Conventional ESD protection techniques applicable for ICs cannot be efficiently implemented in RFICs and in particular, RFICs for millimeter wave frequencies. The conventional techniques introduce significant parasitic capacitance and resistance, thus degrading RF front-end performance.

In the related art, several on-chip ESD protection techniques for RFIC can be found. For example, the article "ESD Protection for a 5.5 GHz LNA in 90 nm RF CMOS Implementation Concepts, Constraints and Solutions" to Natarajan, et al., proposes to place inductors at input and output pins of the LNA to divert the ESD current away from the LNA core to the power lines. The size of the inductors can be relatively small, thus suitable for RFIC designs where area is limited. However, the fabricated inductors are characterized by high series resistance due to the thin metal layer of the semiconductor substrate. This reduces the effectiveness of the ESD protection. Further, the inductors introduce high heat dissipation in a long-lasting ESD pulse. This can lead, for example, to open interconnect.

Figure 1A:
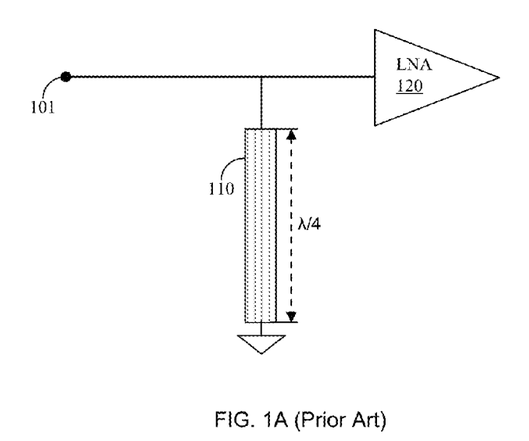
FIGS. 1A and 1B are schematic diagrams of conventional ESD protection circuits.

Another ESD solution designed for protection of RFICs is based on a shorted-stub transmission line. As illustrated in FIG. 1A, the transmission line 110 is connected between an input pin 101 of a LNA 120 and the ground. The shorted-stub transmission line 110 discharges ESD pulses, while at the same time operates as a matching circuit for a normal operation of the LNA 120. This ESD protection solution suffers from the deficiencies noted above, e.g., high resistance and high heat dissipation. In addition, the length of the transmission line 110 is typically $\lambda/4$, where $\lambda$ is the wavelength of a signal amplified by the LNA 120. For example, for 60 GHz signals the length of the transmission line 110 is not less than 600 micron (when fabricating a transmission line on a multilayer semiconductor substrate the length of each line is shorter than $\lambda/4$ due to characteristics of the substrate).

Figure 1B:
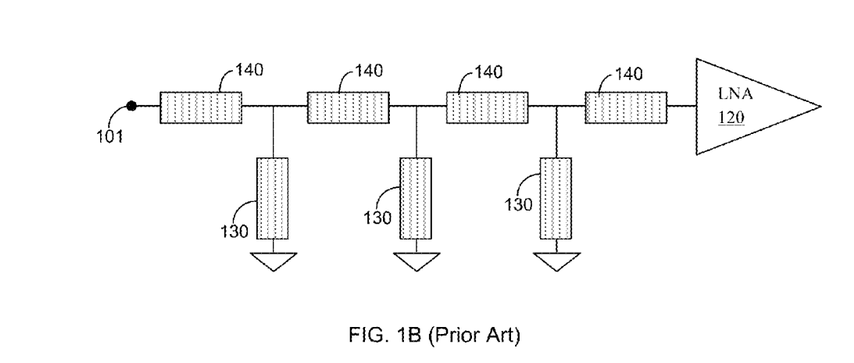

In order to improve the protection efficiency and reduce the heat dissipation, a ladder-shaped ESD protection circuit is proposed in "Ladder-shaped network for ESD protection of millimeter-wave CMOS ICs" to Park, et al. As illustrated in FIG. 1B, the ESD protection circuit consists of three shorted stubs 130 and three series stubs 140. The length of each shorted stub 130 is 300 micron. The ladder-shaped structure operates as a high-pass filter, i.e., filtering ESD pulses characterized by a low frequency relative to the operating frequency of the LNA.

The major disadvantage of the shorted-stub based ESD protection solutions, illustrated in FIGS. 1A and 1B, is that they are considerably large in size for RFIC designs. Therefore, such structures are unsuitable for use in RFICs, and more particularly elements that should be integrated in devices for 60 GHz band applications.

Therefore, it would be advantageous to provide a solution for designing a compact size circuit for providing robustness in ESD protection for RFICs operation in millimeter wave frequencies.

SUMMARY OF THE INVENTION

Certain embodiments of the invention include a method for designing an electrostatic discharge (ESD) circuit for protection of millimeter wave electrical elements. The method comprises determining a resistance value of the ESD circuit; computing a length and a width of a metal line based on the resistance value, wherein the length and the width of the metal line are maximized to meet at most the determined resistance value; computing an inductance value of the metal line; computing a capacitance value of a capacitor to be connected in parallel to the metal line to resonate the metal line at an operating frequency band of the millimeter wave electrical elements; connecting the metal line to a ground of a multilayer substrate on which the ESD circuit is fabricated; and connecting a capacitor having the computed capacitance value in parallel to the metal line.

Certain embodiments of the invention further include a miniaturized electrostatic discharge (ESD) protection circuit designed for millimeter wave electrical elements, wherein the ESD protection circuit is fabricated on a multilayer substrate. The method comprises a metal line being connected at one end to a ground and at other end to a connective strip, wherein a length of the metal line is a maximum length that achieves a resistance value defined for the ESD protection circuit and a width of the metal line is set to a maximum width allowed for the multilayer substrate, wherein the metal line introduces an inductance value into the ESD protection circuit; and a capacitor being connected in parallel to the metal line and having a capacitance value resonating the metal line at an operating frequency band, thereby the ESD protection circuit shunts ESD pulses to the ground and passes signals at the operating frequency band.

Certain embodiments of the invention also include an electrostatic discharge (ESD) protection circuit designed for protecting millimeter wave electrical elements. The method comprises a lumped-based resonator element that at one end is connected to a ground and at other end to a connective stripe, wherein the lumped-based resonator consists of an inductor connected in parallel to a capacitor, the lumped-based resonator resonates at an operating frequency band, thereby shunting ESD pulses to the ground and passing signals at the operating frequency band.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF THE INVENTION

The embodiments disclosed by the invention are only examples of the many possible advantageous uses and implementations of the innovative teachings presented herein. In general, statements made in the specification of the present application do not necessarily limit any of the various claimed inventions. Moreover, some statements may apply to some inventive features but not to others. In general, unless otherwise indicated, singular elements may be in plural and vice versa with no loss of generality. In the drawings, like numerals refer to like parts through several views.

Figure 2:
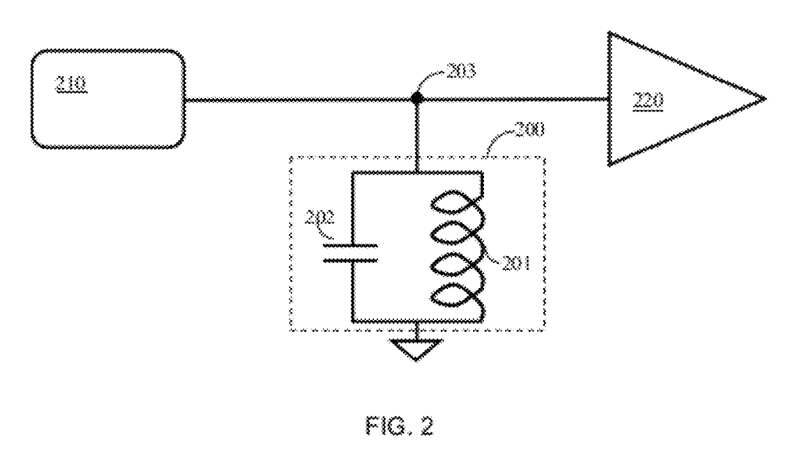
FIG. 2 is a schematic diagrams of a ESD protection circuit according to an embodiment of the invention.

FIG. 2 shows a schematic diagram of an ESD protection circuit 200 in accordance with an embodiment of the invention. The circuit 200 is based on a lumped LC resonator shored to the ground. The LC is a resonator is a network of an inductor 201 and a capacitor 202. The circuit 200 is connected at a point 203 between an input/output pad 210 of an IC and a circuitry (e.g., a LNA) 220. Typically, the pad 210 is an interface point to an antenna. The pad 210 may be also a chip bump depending on the packaging technique of the RFIC (chip).

The ESD protection circuit 200 is designed to be transparent to the operation of the IC. With this aim, an inductance value of the inductor 201 is small and the capacitance of the capacitor is selected as such to resonate the inductor 201 at the operating frequency band of the circuitry 220. Further, the inductor 201 shunts ESD pulses to the ground. The frequency of an ESD signal is significantly lower than the operation frequency band of the circuitry 220. In accordance with an embodiment of the invention, the operating frequency band is the 60 GHz band. Another property of the ESD protection circuit 200 is low signal loss, thus signals travel through the connection point 203 are not attenuated by the ESD protection circuit 200. On the other hand, a low resistance in the ESD event path, of the ESD protection circuit 200 is achieved, in accordance with the teachings of the invention, by implementing the inductor 201 as a short and very wide metal line (strip). This implementation also results in a compact size ESD protection circuit 200 relative to prior solutions discussed above.

Figure 3:
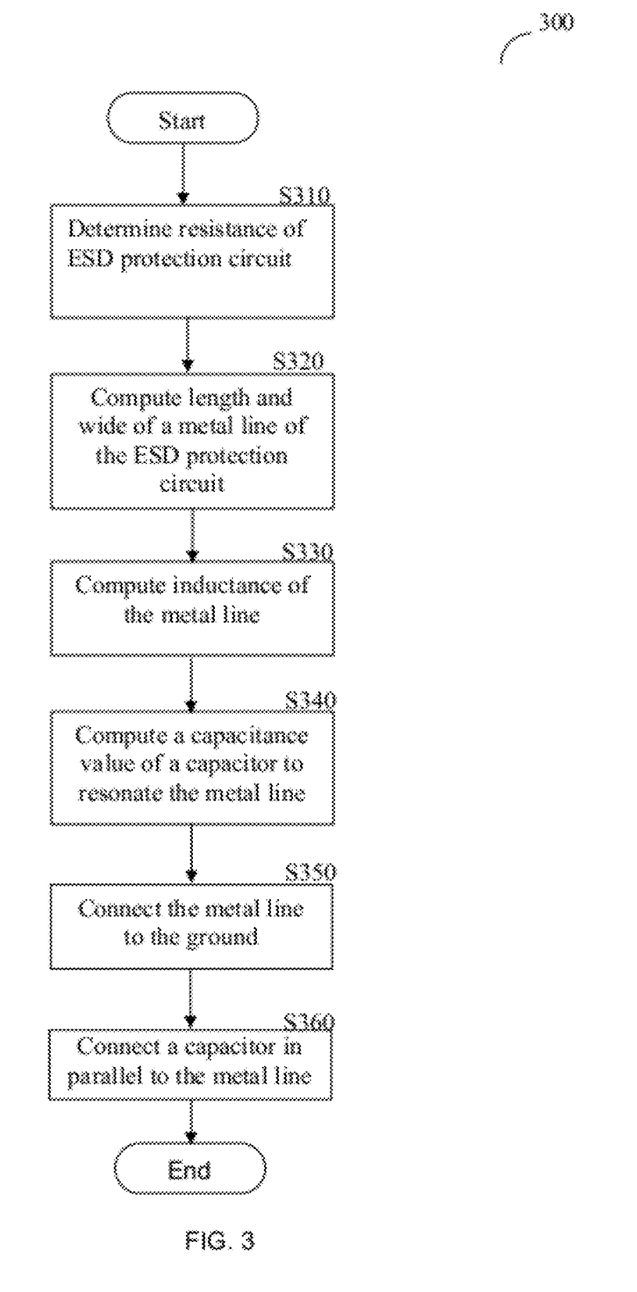
FIG. 3 is a flowchart illustrating a method for designing ESD protection circuit for millimeter wave RFICs according to an embodiment of the invention.

FIG. 3 shows a non-limiting and exemplary flowchart 300 illustrating a method for designing ESD protection circuit for millimeter wave RFICs in accordance with an embodiment of the invention. It should be noted that the numbering of the method does not imply a specific order of occurrence. At S310, the resistance of the ESD protection circuit (hereinafter ESD resistance) is determined based, in part, on a class of an ESD protection required for the IC. The class of protection defines the ability of the ESD protection circuit to shunt ESD pulses and can be selected according to ESD standards, such as human body model (HBM) ESD, machine model (MM) ESD, charged device model (CDM) ESD, and the like. In an embodiment of the invention, the ESD resistance, i.e., the metal resistance in the ESD event path to ground is below 1 Ohm.

A metal line is required for the implementation of the LC lumped resonator. With this aim, at S320, the length and wide of the metal line are computed based on the resistance determined at S310 and the process utilized for fabricating the designed ESD circuit. A foundry of the multilayer substrate provides the metalization layers resistance. The computing step of S320 includes computing the maximum metal line (stripe) length achieving the desired ESD resistance or lower, such that the maximum metal width allowed by the foundry is used for this metal line.

The metal line introduces a certain level of inductance, thus acts as an inductor (e.g., inductor 201). At S330, the inductance value of the metal line is computed. It should be noted that the inductance value is a function of the design process and can be kept at a well-predictable value. Typically, the minimum accurately predictable inductance value is approximately 20 pH, which is considered a relatively low inductance value.

At S340, a capacitance value of a capacitor to be connected in parallel to the metal line is computed. The capacitance is computed to achieve resonance at the operating frequency band (e.g., 60 GHz) of the RFIC. In an exemplary embodiment, the capacitance value C is computed using the following equation:

$$C = \frac{1}{(L(2\pi f))^2}$$

where, f is the operating frequency band and L is the inductance value computed at S330.

At S350, the metal line is connected to the ground of a multilayer substrate on which the ESD protection circuit is fabricated. At S360, a capacitor having the computed capacitance value is connected in parallel to the metal line composing the inductor.

As a non-limiting example for the method described above, a deep sub-micron CMOS process is utilized for the fabrication. In this process, the resistance per square of a copper metal line (stripe) is 0.02 Ohms/square. It should be noted that an IC designer cannot control the thickness of the metal layers, but rather the length and width of the metal lines. The resistance of a metal line is proportional to length and inversely to width.

The length per width dimensions of the metal line are 80 micron/12 micron implying a total resistance of 0.02*6.67=0.13 Ohms. This resistance value is well below hazardous values of approximately 2 Ohms. The metal line has an inductance value of L=35 pH, implying that a capacitance value required to resonate in a frequency band of 60 GHz is 201 fF (femto Farad). Such capacitance value yields a compact capacitor providing a total structure of the ESD protection circuit of 30 micron by 120 micron.

In an exemplary embodiment of the invention, in order to maintain good ESD robustness, the ESD protection circuit 200 is located as close as possible to the signal interface with off-chip elements. That is, the circuit is placed close to the ground and pads. The dimensions of the pads are such that they will influence the operation of the ESD protection circuit. To mitigate this influence and eliminate the burden of a chip designer from considering the pads' characteristics when designing the ESD protection circuit, a slot in the metal ground is inserted between the ESD protection circuit and the signal's ground bumps/pads. This technique provides an isolation of an unpredicted ground path when designing the ESD protection as a stand-alone circuit.

It should be noted that the method for designing the ESD protection circuit, can be implemented in any computer aided design (CAD) tools utilized in the design of RFICs.

Figure 4:
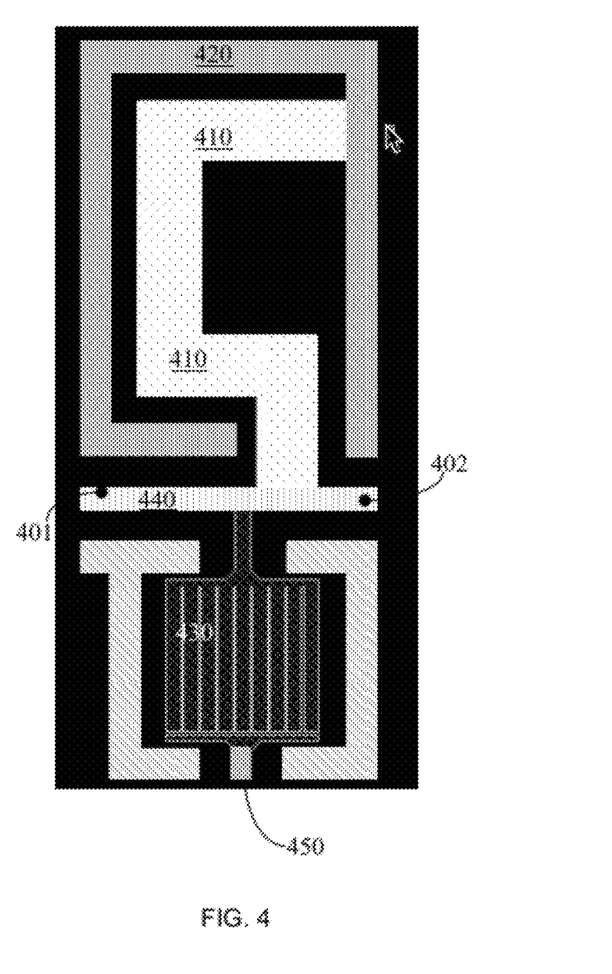
FIG. 4 is a schematic diagram of a fabricated ESD protection circuit according to an embodiment of the invention.

FIG. 4 shows an exemplary diagram of an ESD protection circuit as fabricated on a multilayer substrate according to an embodiment of the invention. The circuit is designed to operate in RFIC designed for millimeter wave frequencies, e.g., a frequency band of 60 GHz. The circuit 400 shunts to ground ESD pulses at a frequency range between direct current (DC) to 2 GHz, while passing signals with millimeter wave frequencies. In accordance with an embodiment of the invention, the ESD protection circuit is fabricated using a deep micron CMOS process, e.g., a 90 nanometer CMOS process and bellow.

In the ESD protection circuit, the metal line 410 is connected to a perimeter ground 420 and further coupled to a capacitor 430 and a connective strip 440. The connective strip 440, at one end, is connected to an input/output pad 401 of the RFIC (e.g., a connection point to an antenna) and, at the other end (402) to the RFIC's circuitry (e.g., a LNA). The capacitor 440 is shunt to the ground at a connection point 450. As can be noticed, the metal line 410 is wider than the connective strip 440. The width of a connective strip in a typical millimeter-wave design is such that a characteristic impedance in the order of 50 Ohms is achieved. However, according to embodiments of the invention, the metal line 410 is significantly wider to achieve at least the properties mentioned above, i.e., low ESD resistance and compact size structure.

In accordance with an exemplary embodiment of the invention, the metal line's 410 length is 132 microns, and width is 12 microns. The size of the ESD protection circuit is 150 microns by 60 microns. Thus, the length of a metal line 410 is significantly less than a quarter-lambda ($\lambda/4$).

It should be noted that in certain embodiments of the invention, the metal line forming the inductor can be fabricated as several parallel metal strips, from different metal layers, all being connected together.

Figure 5:
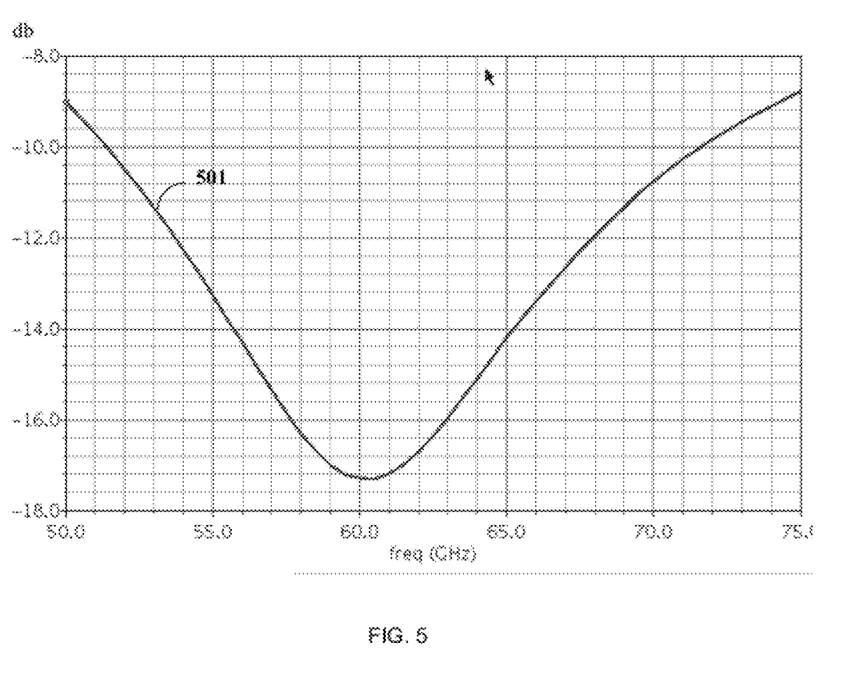
FIG. 5 depicts a graph illustrating return loss varying with frequency measured for the ESD protection circuit designed in the operating frequency according to an embodiment of the invention.

FIG. 5 depicts a graph 501 of a return-loss varying with frequency results simulated for an ESD protection circuit, constructed in accordance with an embodiment of the invention, in an operating frequency of a 60 GHz frequency band. The graph 501 results from a 2-port simulation where port 1 is to be connected to the protected circuit (e.g., connected at pin 402). The return-loss is a measure of voltage standing wave ratio (VSWR), expressed in decibels (db) and may be caused due to an impedance mismatch. A high value of return-loss denotes better quality of the electrical element under test. The graph 501 depicts measured at the return-loss the input to the RFIC circuitry. As can be noticed for 60 GHz frequency band, the measured return-loss is well above 16 db. A person with ordinary skill the art should appreciate that such a result represents a low return-loss value, thus good performance of the ESD protection circuit.

Figure 6:
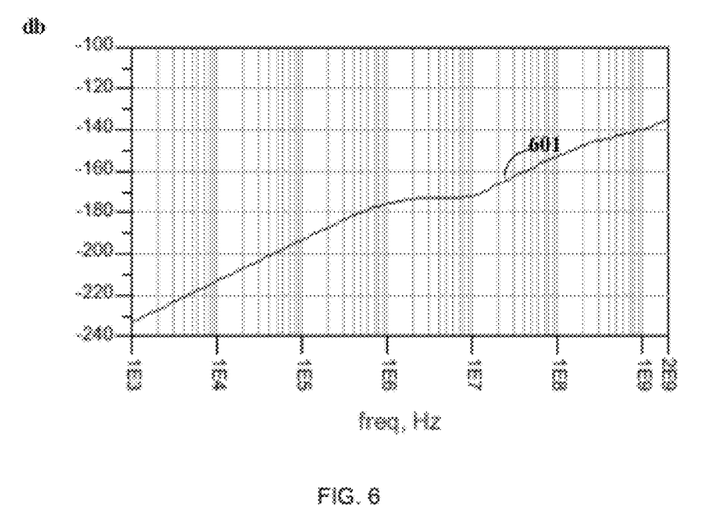
FIG. 6 depicts a graph illustrating the AC transfer across the ESD protection circuit in the frequency band of ESD pulses.

FIG. 6 depicts a graph 601 representing the transfer voltage gain of an ESD signal simulated from the input to the output of the ESD protection circuit. A frequency of an ESD signal (pulse) can be between 1 KHz and 2 GHz. As can be noticed, in the entire frequency band of an ESD signal, the output amplitude of such a signal is below −130 db. That is, the ESD protection circuit attenuates an input ESD signal to amplitude less than −130 db. A person with ordinary skill the art should appreciate that such a result represents a shunt of an ESD signal, thus good performance of the ESD protection circuit.

It is important to note that these embodiments are only examples of the many advantageous uses of the teachings discussed herein. Specifically, the teachings disclosed herein can be adapted in any type of consumer electronic devices where reception and transmission of millimeter wave signals is needed. More particularly, the teachings of the present invention can be used in design of miniaturized RFICs utilized in devices supporting applications operable in the 60 GHz frequency band. Such applications include, but are not limited to, wireless high definition TV (HDTV), wireless docking station, wireless Gigabit Ethernet, and many others. The 60 GHz frequency band applications are designed to be integrated in portable devices including, but not limited to, netbook computers, tablet computers, smartphones, laptop computers, and the like. It should be appreciated that as physical size of such devices is relatively small, thus the area for installing additional circuitry to support 60 GHz applications is limited, hence the disclosed ESD protection is highly suitable for implementation of RFICs for 60 GHz band applications.

All examples and conditional language recited herein are intended for pedagogical purposes to aid the reader in understanding the principles of the invention and the concepts contributed by the inventor to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A method for designing an electrostatic discharge (ESD) circuit for protection of millimeter wave electrical elements, the method is performed by a computer aided design (CAD) system comprising:

determining, by the CAD system, a resistance value of the ESD circuit, wherein the resistance of the ESD circuit is determined based on a class of ESD protection required for the electrical millimeter wave elements;

computing a length and a width of a metal line based on the resistance value, wherein the length and the width of the metal line are maximized to meet at most the determined resistance value;

computing an inductance value of the metal line;

computing, a capacitance value of a capacitor to be connected in parallel to the metal line to resonate the metal line at an operating frequency band of the millimeter wave electrical elements;

connecting the metal line to a ground of a multilayer substrate on which the ESD circuit is fabricated, wherein the ESD circuit is fabricated on the multilayer substrate using a fabrication process including at least a deep sub-micron used for a 90 nanometer or below integrated circuit fabrication process; and connecting a capacitor having the computed capacitance value in parallel to the metal line.

2. The method of claim 1, wherein the maximum width of the metal line is determined by a foundry of the multilayer substrate.

3. The method of claim 2, wherein the computed length of the metal line is further based on a metallization layers resistance.

4. The method of claim 1, wherein the class of ESD protection is determined based on an ESD protection standard, wherein the ESD protection standard is at least one of: human body model (HBM) ESD, machine model (MM) ESD, and charged device model (CDM) ESD.

5. The method of claim 4, wherein the metal line acts as an inductor.

6. The method of claim 1, wherein the ESD circuit shunts ESD pulses to the ground and passes signals at the operating frequency band.

7. The method of claim 6, wherein the operating frequency band is a 60 GHz frequency band.

8. A miniaturized electrostatic discharge (ESD) protection circuit for millimeter wave electrical elements, comprising:

a metal line being connected at one end to a ground and at other end to a connective strip, wherein a length of the metal line is a maximum length that achieves a resistance value defined for the ESD protection circuit and a width of the metal line is set to a maximum width allowed for the multilayer substrate, wherein the metal line introduces a inductance value into the ESD protection circuit wherein the resistance of the ESD protection circuit is determined based on a class of ESD protection required for the electrical millimeter wave elements, wherein the ESD protection circuit is fabricated on a multilayer substrate using a fabrication process including at least a deep sub-micron used for a 90 nanometer or below integrated circuit fabrication process; and a capacitor being connected-in parallel to the metal line and having a capacitance value resonating the metal line at an operating frequency band, thereby the ESD protection circuit shunts ESD pulses to the ground and passes signals at the operating frequency band.

9. The miniaturized ESD protection circuit of claim 8, wherein the maximum width of the metal line is determined by a foundry of the multilayer substrate.

10. The miniaturized ESD protection circuit of claim 8, wherein the length of the metal line is further based on a metalization layers resistance.

11. The miniaturized ESD protection circuit of claim 8, wherein the resistance of the ESD protection circuit is determined based on a class of ESD protection required for the electrical millimeter wave elements.

12. The miniaturized ESD protection circuit of claim 8, wherein the class of ESD protection is determined based on an ESD protection standard, wherein the ESD protection standard is at least one of: human body model (HBM) ESD, machine model (MM) ESD, and charged device model (CDM) ESD.

13. The miniaturized ESD protection circuit of claim 11, wherein the resistance value of the ESD protection circuit is below 1 Ohm.

14. The miniaturized ESD protection circuit of claim 8, wherein the inductor is characterized by a low inductance value.

15. The miniaturized ESD protection circuit of claim 8, wherein the operating frequency band is a 60 GHz frequency band.

16. The miniaturized ESD protection of claim 8, wherein the connective strip is connected at one end to an antenna and at other end to a circuitry of a radio frequency integrated circuit (RFIC).

17. The miniaturized ESD protection of claim 16, is integrated in a RFIC adapted for 60 GHz band applications.

18. An electrostatic discharge (ESD) protection circuit for protecting millimeter wave electrical elements, comprising:

a lumped-based resonator element that at one end connected to a ground and at the other end connected to a connective stripe, wherein the lumped-based resonator consists of an inductor connected in parallel to a capacitor, the lumped-based resonator resonates at an operating frequency band, thereby shunting ESD pulses to the ground and passing signals at the operating frequency band, and wherein the lump-based resonator element is a metal line whose length and width are computed based on a resistance value determined based on a class of ESD protection required for the electrical millimeter wave elements, wherein the ESD protection circuit is fabricated on a multilayer substrate using a fabrication process including at least a deep sub-micron used for a 90 nanometer or below integrated circuit fabrication process.

19. The ESD protection circuit of claim 18, wherein the inductor is characterized by a low inductance value.

20. The ESD protection circuit of claim 18, wherein a resistance value of the lumped-based resonator is below 1 Ohm.

21. The ESD protection circuit of claim 18, wherein the operating frequency band is a 60 GHz frequency band.

22. The ESD protection circuit of claim 18, is being integrated in an impedance matching network.

23. The ESD protection circuit of claim 18, wherein the capacitor comprises parasitic capacitance of the inductor causing the lumped-based resonator to resonate at the operating frequency band.

* * * * *